(12) United States Patent
Fujiyoshi et al.

(10) Patent No.: US 9,500,720 B2
(45) Date of Patent: Nov. 22, 2016

(54) SEMI-HARD MAGNETIC MATERIAL AND THEFT-PREVENTION MAGNETIC SENSOR USING SAME AND METHOD OF MANUFACTURING SEMI-HARD MAGNETIC MATERIAL

(75) Inventors: Masaru Fujiyoshi, Yasugi (JP); Shin-ichiro Yokoyama, Yasugi (JP)

(73) Assignee: HITACHI METALS, LTD., Tokyo (JP)

(*) Notice: Subject to any disclaimer, the term of this patent is extended or adjusted under 35 U.S.C. 154(b) by 253 days.

(21) Appl. No.: 14/239,702

(22) PCT Filed: Aug. 17, 2012

(86) PCT No.: PCT/JP2012/070886
§ 371 (c)(1),
(2), (4) Date: Apr. 17, 2014

(87) PCT Pub. No.: WO2013/027665
PCT Pub. Date: Feb. 28, 2013

(65) Prior Publication Data
US 2014/0232385 A1  Aug. 21, 2014

(30) Foreign Application Priority Data

Aug. 19, 2011  (JP) ................................. 2011-179346

(51) Int. Cl.
*G01R 33/02* (2006.01)
*C21D 6/00* (2006.01)
(Continued)

(52) U.S. Cl.
CPC .............. *G01R 33/02* (2013.01); *C21D 6/00* (2013.01); *C21D 8/0247* (2013.01); *C22C 38/00* (2013.01);
(Continued)

(58) Field of Classification Search
CPC ......... G01R 33/02; C21D 8/02; H01F 1/147; H01F 1/15308; C22C 38/04; C22C 38/06; C22C 38/08; C22C 38/14
See application file for complete search history.

(56) References Cited

U.S. PATENT DOCUMENTS 6,001,194 A * 12/1999 Nakaoka ................ B82Y 25/00
                                                 148/306
6,020,074 A *  2/2000 Scandagliato ..... G08B 13/2408
                                                 242/430
(Continued)

FOREIGN PATENT DOCUMENTS

JP          49-15616         2/1974
JP          49-59725         6/1974
(Continued)

OTHER PUBLICATIONS

Chinese Office Action issued Apr. 3, 2015 in corresponding Chinese Patent Application No. 201280040056.9.
(Continued)

*Primary Examiner* — Vinh Nguyen
*Assistant Examiner* — Alvaro Fortich

(57) ABSTRACT

A semi-hard magnetic material that is formed with equal to or more than 5.0% but less than 13.0% of Ni by mass, equal to or more than 0.5% but equal to or less than 4.0% of Mn by mass, more than 0% but equal to or less than 3.0% of Al by mass, more than 0% but equal to or less than 1.0% of Ti by mass and a remainder of Fe and an impurity, that has a coercivity of 1000 to 2400 A/m and that has a residual magnetic flux density of 1.3 T or more. A method of manufacturing the above semi-hard magnetic material wherein the material is a thin plate having a thickness of 0.030 to 0.30 mm and, after a cold rolling, performing an aging treatment on the thin plate at a temperature of 520° C. to 680° C.

6 Claims, 4 Drawing Sheets

(51) Int. Cl.
*C22C 38/00* (2006.01)
*C22C 38/02* (2006.01)
*C22C 38/04* (2006.01)
*C22C 38/06* (2006.01)
*C22C 38/08* (2006.01)
*C22C 38/14* (2006.01)
*C21D 8/02* (2006.01)
*G01R 33/00* (2006.01)
*H01F 1/147* (2006.01)
*G08B 13/24* (2006.01)
*H01F 1/153* (2006.01)

(52) U.S. Cl.
CPC ........... *C22C 38/001* (2013.01); *C22C 38/002* (2013.01); *C22C 38/02* (2013.01); *C22C 38/04* (2013.01); *C22C 38/06* (2013.01); *C22C 38/08* (2013.01); *C22C 38/14* (2013.01); *G01R 33/0052* (2013.01); *H01F 1/14716* (2013.01); *G08B 13/2442* (2013.01); *H01F 1/15308* (2013.01)

(56) References Cited

U.S. PATENT DOCUMENTS

| | | | | |
|---|---|---|---|---|
| 6,372,062 B1* | 4/2002 | Masahiro | ............... | B32B 15/01 148/527 |
| 6,689,490 B2* | 2/2004 | Weber | ............... | C21D 8/12 116/204 |
| 6,774,793 B1* | 8/2004 | Brauer | ............... | G08B 13/2411 235/493 |
| 6,893,511 B1* | 5/2005 | Nakaoka | ............... | B32B 15/015 148/120 |
| 7,338,709 B1* | 3/2008 | Wada | ............... | D02G 3/02 428/364 |
| 2004/0066297 A1 | 4/2004 | Weber et al. | | |
| 2008/0000560 A1* | 1/2008 | Yokoyama | ............... | C21D 6/00 148/621 |

FOREIGN PATENT DOCUMENTS

| | | |
|---|---|---|
| JP | 56-147409 | 11/1981 |
| JP | 57-85950 | 5/1982 |
| JP | 2001-502759 | 2/2001 |
| WO | WO 99/06977 | 2/1999 |

OTHER PUBLICATIONS

International Search Report mailed Oct. 2, 2012 in corresponding International Patent Application No. PCT/JP2012/070886.

Toshio Takahashi, "Keidenki Tesshin-yo Fe—Mn—Ni-kei Han Koshitsu Jisei Gokin (Semihard Magnetic Ally of Fe—Mn—Ni System for Latching Reloy,") *Denshi Tsushin Gakkai Ronbunshi* (*Transactions of the Institute of Electronics, Information and Communication Engineers,*) vol. 59-C, No. 12, 1976, pp. 801-808.

* cited by examiner

SEMI-HARD MAGNETIC MATERIAL AND THEFT-PREVENTION MAGNETIC SENSOR USING SAME AND METHOD OF MANUFACTURING SEMI-HARD MAGNETIC MATERIAL

CROSS-REFERENCE TO RELATED APPLICATIONS

This application is a U.S. national stage application of PCT/JP2012/070886 filed Aug. 17, 2012 and claims foreign priority benefit of Japanese Patent Application No. 2011-179346 filed Aug. 19, 2011 in the Japanese Intellectual Property Office, the contents of both of which are incorporated herein by reference.

TECHNICAL FIELD

The present invention relates to a semi-hard magnetic material, a theft-prevention magnetic sensor using such a semi-hard magnetic material and a method of manufacturing a semi-hard magnetic material.

BACKGROUND ART

Conventionally, in order to prevent thefts in large volume retailers and the like, magnetic sensors are used. The element of such a magnetic sensor is formed with a warning thread that is formed of an amorphous ferromagnetic alloy and a magnetic bias thread that is formed of a semi-hard magnetic material.

As the semi-hard magnetic material for the magnetic bias thread, for example, a semi-hard magnetic material is proposed that is formed with 8.0 to 25.0 mass percent of Ni, 0.5 to 3 mass percent of Ti, 1.5 to 4.5 mass percent of Al and the remainder of Fe (see, for example, patent document 1). It is disclosed that this semi-hard magnetic material has a coercivity Hc of 1000 to 2400 A/m and a residual magnetic flux density Br of 1.3 T or more, and in particular, as an advantageous alloy, a semi-hard magnetic material containing 13.0 to 17.0 percent of Ni, 1.8 to 2.8 percent of Al and 0.5 to 1.5 percent of Ti is disclosed, and in its embodiment, semi-hard magnetic materials each containing high percentages of Ni, that is, a 15.0 percent of Ni and a 18.0% of Ni are disclosed.

RELATED ART DOCUMENT

Patent Document

Patent document 1: Japanese Unexamined Patent Application Publication (Translation of PCT Application) No. 2001-502759

DISCLOSURE OF THE INVENTION

Problems to be Solved by the Invention

In the semi-hard magnetic material disclosed in patent document 1 described above, it is advantageous to have the coercivity and the residual magnetic flux density which are required for a magnetic bias thread but it is disadvantageous that the semi-hard magnetic material contains large amount of Ni which is a rare metal to increase its cost.

An object of the present invention is to provide a resource-saving semi-hard magnetic material that maintains, in the same range as a conventional semi-hard magnetic material, a coercivity and a residual magnetic flux density required for the magnetic bias thread of a theft-prevention magnetic sensor and that reduces a Ni content, a theft-prevention magnetic sensor using such a semi-hard magnetic material, and a method of manufacturing a semi-hard magnetic material.

Means for Solving the Problem

The present inventors have examined the relationship between the chemical composition and the magnetic property of the semi-hard magnetic material, have found that Mn, which is inexpensive as compared with Ni and is rich in resource reserves, is actively contained and thus the same magnetic property as a conventional one can be obtained even if a Ni content is reduced as compared with the conventional semi-hard magnetic material and have reached the present invention.

Specifically, according to the present invention, there is provided a semi-hard magnetic material that is formed with equal to or more than 5.0% but less than 13.0% of Ni by mass, equal to or more than 1.0% but equal to or less than 4.0% of Mn by mass, more than 0% but equal to or less than 3.0% of Al by mass, more than 0% but equal to or less than 1.0% of Ti by mass and a remainder of Fe and an impurity, that has a coercivity of 1000 to 2400 A/m and a residual magnetic flux density of 1.3 T or more.

In the present invention, the semi-hard magnetic material is a thin plate having a thickness of 0.030 to 0.30 mm.

According to the present invention, there is provided a theft-prevention magnetic sensor where a magnetic bias thread is formed of the semi-hard magnetic material described above, and the theft-prevention magnetic sensor is configured by combining the magnetic bias thread with a warning thread formed of an amorphous ferromagnetic alloy.

According to the present invention, there is provided a method of manufacturing the semi-hard magnetic material described above where after cold rolling, an aging treatment is performed at a temperature of 520 to 680° C.

Effects of the Invention

In the semi-hard magnetic material of the present invention, even though the Ni content which affects a magnetic property is reduced, it is possible to maintain a coercivity and a residual magnetic flux density required for the magnetic bias thread of a theft-prevention magnetic sensor within the same range as a conventional semi-hard magnetic material. Hence, the semi-hard magnetic material of the present invention has the effect of being inexpensive as compared with the conventional semi-hard magnetic material and a resource-saving effect. Consequently, a theft-prevention magnetic sensor using such a semi-hard magnetic material also has the effect of being inexpensive and resource-saving.

BEST MODE FOR CARRYING OUT THE INVENTION

Figure 1:
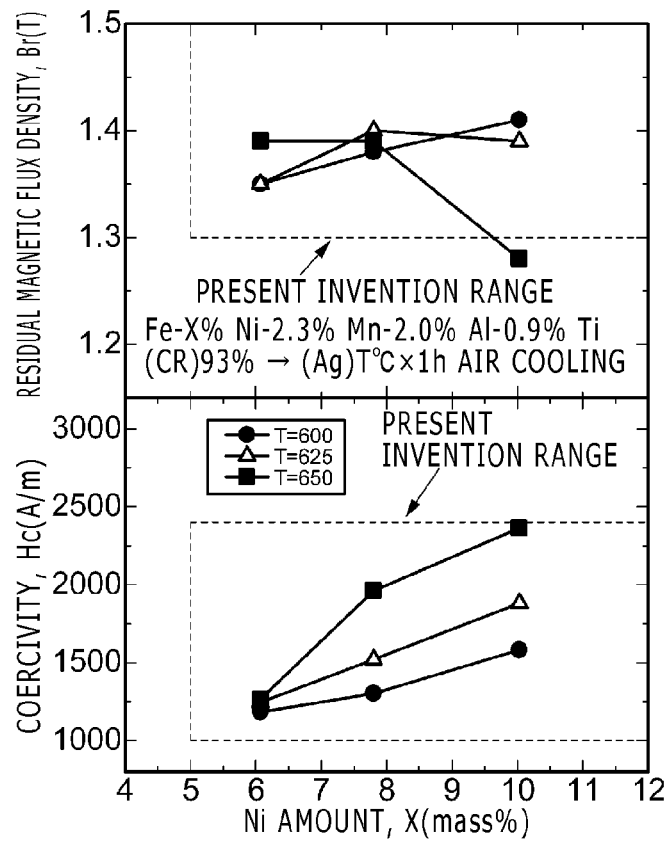
FIG. 1 A diagram showing an example of the relationship between the amount of Ni and the magnetic property of a semi-hard magnetic material.

As described above, the important feature of the present invention is an optimum composition that reduces a Ni content which is an expensive rare metal and obtains the same magnetic property as a conventional one. Elements and their contents are specified in the present invention because of the following reasons. The contents are expressed in percent by mass.

Mn: 1.0% or More but 4.0% or Less

Mn is an important element in the present invention. In the present invention, the decrease in the performance of production of an austenite and hence a martensite caused by the decrease in Ni is compensated for by Mn. Moreover, as with Ni, Mn is an element that is alloyed with Fe to act to increase the coercivity of a semi-hard magnetic material. Hence, in the present invention, it is mandatory to add Mn that is 0.5% or more but 4.0% or less. However, when Mn is less than 0.5%, the effect of increasing the coercivity is low whereas when Mn exceeds 4.0%, the coercivity is excessively high and the residual magnetic flux density is reduced. Hence, Mn is specified to be 0.5% or more but 4.0% or less. The preferable lower limit of Mn is 1.0%, and the more preferable lower limit is 2.0%. The preferable upper limit of Mn for maintaining a high residual magnetic flux density is 3.0%.

Ni: 5.0% or More but Less than 13.0%

Ni is an element that enhances the performance of production of an austenite. Ni is an element in which when a Ni content of 25.0% or less is alloyed with Fe, since a transformation start temperature (Ms) from an austenite to a martensite is higher than room temperature, Ni acts to have a martensite structure of body-centered cubic crystal at room temperature. Since in the martensite structure of the Fe—Ni alloy, as compared with the ferrite structure of pure Fe, the distortion of the interior of the material is large, and domain wall motion is unlikely to occur, the coercivity is increased as compared with the ferrite structure of pure Fe. Hence, Ni is a mandatory element of the present invention that needs to adjust the coercivity of the semi-hard magnetic material. When Ni is less than 5.0%, the effect of increasing the coercivity of the semi-hard magnetic material is low whereas when Ni is 13.0% or more, the coercivity is excessively high in a composition including a predetermined amount of Mn in the present invention. Moreover, since the residual magnetic flux density is slightly reduced, and the resource-saving effect is degraded, Ni is specified to be 5.0% or more but less than 13.0%. The preferable lower limit of Ni for acquiring the effect of increasing the coercivity is 6.5%, and the more preferable lower limit is 8.0%. Since as the amount of Ni is increased, the residual magnetic flux density is saturated, and the coercivity is increased, the preferable upper limit of Ni is 11.5%. The more preferable upper limit is 11.0%, and the further preferable upper limit is 10.5%.

Al: More than 0% but Equal to or Less than 3.0%

Al is an effective element of the present invention that produces an intermetallic compound with Ni contained in the semi-hard magnetic material to increase the coercivity and the residual magnetic flux density of the semi-hard magnetic material. Hence, it is mandatory to add Al of more than 0%. However, since when Al exceeds 3.0%, the residual magnetic flux density is reduced, the upper limit of Al is specified to 3.0%. The preferable lower limit of Al for reliably acquiring the effect of increasing the residual magnetic flux density is 0.25%, and the more preferable lower limit is 1.0%. The preferable upper limit of Al for maintaining a high residual magnetic flux density is 2.5%.

Ti: More than 0% but Equal to or Less than 1.0%

As with Al, Ti is an effective element that produces an intermetallic compound with Ni contained in the semi-hard magnetic material to increase the coercivity and the residual magnetic flux density of the semi-hard magnetic material. Hence, it is mandatory to add Ti of more than 0%. However, since when Ti exceeds 1.0%, the residual magnetic flux density is excessively high, the upper limit of Ti is specified to 1.0%. The preferable lower limit of Ti for acquiring the effect of increasing the residual magnetic flux density is 0.3%, and the more preferable lower limit is 0.5%.

The Remainder of Fe and Impurities

The remainder is substantially Fe but contains impurities that are mixed in inevitably at the time of manufacturing. An impurity content is preferably low but it is acceptable as long as the impurity content is as follows.

$C \leq 0.03\%$, $Si \leq 0.50\%$, $P \leq 0.10\%$, $S \leq 0.05\%$, $N \leq 0.03\%$, $O \leq 0.01\%$ A description will now be given of the reason why the magnetic property of the semi-hard magnetic material of the present invention is specified such that the residual magnetic flux density (Br) is 1.3 T or more and the coercivity (Hc) is 1000 to 2400 A/m.

For example, when items are arranged at a retailer and an item is stolen, the role of a magnetic bias thread in a theft-prevention magnetic sensor is to apply a magnetic field to a warning thread formed of an amorphous ferromagnetic alloy. Hence, the residual magnetic flux density is required to be high. The reason why the residual magnetic flux density is set at 1.3 T or more is that this range is a preferable property for the magnetic bias thread of the theft-prevention magnetic sensor.

Although in the present invention, it is not particularly specified, as an index for indicting that even though an external magnetic field is slightly varied, the residual magnetic flux density is not varied, the squareness of a B—H curve is preferably high. Specifically, the value of the ratio $Br/B8000$ of the magnetic flux density $B8000$ to the residual magnetic flux density $Br$ when a magnetic field of 8000 A/m is applied is preferably 0.80 or more.

When the coercivity (Hc) is excessively low, if the external magnetic field is slightly varied, the magnitude of the magnetic field applied to the residual magnetic flux density Br and hence the warning thread is also varied to cause an erroneous operation of the theft-prevention magnetic sensor. Hence, the lower limit is set for the coercivity, and is set at 1000 A/m or more.

On the other hand, after a payment is officially made, it is necessary to demagnetize the theft-prevention magnetic sensor so that its sensor function is removed. When the coercivity is excessively high, it is disadvantageously difficult to demagnetize the theft-prevention magnetic sensor. Hence, the upper limit of the coercivity is set at 2400 A/m.

Although in the semi-hard magnetic material of the present invention described above, Ni is reduced, it is possible to obtain the same magnetic property as a conventional semi-hard magnetic material containing a large amount of Ni. Specifically, it is possible to obtain an excellent magnetic property in which the coercivity is 1000 to 2400 A/m and the residual magnetic flux density is 1.3 T or more.

For the semi-hard magnetic material of the present invention, after cold rolling, aging treatment is applied to precipitate an intermetallic compound, and a barrier for domain wall motion and magnetic domain rotation is made, with the result that it is possible to increase the coercivity and the residual magnetic flux density.

The aging treatment for precipitating the intermetallic compound is performed at a temperature of 520 to 680° C. This is because when the aging treatment temperature is less than 520° C., the effect of increasing the coercivity is low probably because the size of the precipitated intermetallic compound is excessively small whereas when the aging treatment temperature exceeds 680° C., the coercivity is reduced probably because the mother phase is recrystallized. Hence, in the present invention, the aging treatment is performed at a temperature of 520 to 680° C. The preferable lower limit for the aging treatment temperature is 550° C., and the more preferable lower limit is 580° C. On the other hand, the preferable upper limit for the aging treatment temperature is 670° C., and he more preferable upper limit is 630° C.

The aging treatment time is preferably 0.5 to 2 hours. This is because it is necessary to diffuse the elements for precipitating the intermetallic compound at the time of aging treatment, with the result that in order to make the diffusion proceed, the aging treatment is preferably retained for more than 0.5 hours. By contrast, even if the aging treatment is retained for more than 2 hours, the state of precipitation of the intermetallic compound is not changed, and the magnetic property is not changed, either. Hence, the aging treatment time is appropriately 0.5 to 2 hours.

The semi-hard magnetic material having the composition described above and according to the present invention is rolled to become a thin plate having a thickness of 0.030 to 0.30 mm, and is thereby suitable for the application of the theft-prevention magnetic sensor. For the application of the theft-prevention magnetic sensor, when the thickness of the plate member is less than 0.03 mm, it is difficult to apply a sufficient magnetic force to a warning thread. When the thickness of the plate member exceeds 0.30 mm, the squareness of the B—H curve is low. The more preferable range is 0.04 to 0.25 mm.

Since the aging treatment described above is a means for adjusting the magnetic property in a state where the thickness of the final product plate is achieved, the aging treatment is preferably performed after the thin plate having a thickness of 0.030 to 0.30 mm is acquired by the cold rolling. When the aging treatment is performed after the cold rolling, the accumulation of distortion caused by the cold rolling increases the drive force for the precipitation of the intermetallic compound at the time of aging treatment, with the result that, advantageously, the intermetallic compound is easily precipitated.

In order to obtain the theft-prevention magnetic sensor using the semi-hard magnetic material of the present invention described above, the semi-hard magnetic material of the present invention is formed into the magnetic bias thread of an appropriate shape, and it is combined with the warning thread formed of the amorphous ferromagnetic alloy.

EXAMPLES

Example 1

The present invention will be described in further details below using examples.

Steel ingots of 10 kg for 8 types of semi-hard magnetic materials shown in table 1 were melted and prepared by vacuum melting.

Alloys Nos. 1 to 3 in the table are semi-hard magnetic materials within a composition range specified in the present invention in which Mn, Al and Ti contents were made substantially constant, and the amount of Ni was varied. Alloys Nos. 3 to 5 are semi-hard magnetic materials within a composition range specified in the present invention in which Ni, Al and Ti contents were made substantially constant, and the amount of Mn was varied. Alloys Nos. 6 and 7 are comparative examples where the Mn content was varied. In an alloy No. 8, the Ni content exceeds the upper limit of the present invention, and the amount of Mn is less than the lower limit of the present invention. The alloy No. 8 is a semi-hard magnetic material of a conventional example corresponding to patent document 1.

TABLE 1

| | (mass %) | | | | | | | | | |
|---|---|---|---|---|---|---|---|---|---|---|
| No | Ni | Mn | Al | Ti | C | Si | P | S | N | O | Remainder |
| 1 | 6.07 | 2.29 | 2.09 | 0.89 | 0.0036 | 0.19 | 0.003 | 0.0031 | 0.0006 | 0.0006 | Fe and impurity |
| 2 | 7.80 | 2.38 | 2.10 | 0.88 | 0.0039 | 0.19 | 0.004 | 0.0031 | 0.0007 | 0.0003 | Fe and impurity |
| 3 | 10.03 | 2.33 | 2.08 | 0.88 | 0.0044 | 0.18 | 0.003 | 0.0022 | 0.0005 | 0.0004 | Fe and impurity |
| 4 | 9.81 | 0.96 | 2.16 | 0.84 | 0.0013 | 0.16 | 0.004 | 0.0022 | 0.0005 | 0.0006 | Fe and impurity |
| 5 | 9.79 | 3.03 | 2.08 | 0.87 | 0.0034 | 0.19 | 0.004 | 0.0033 | 0.0008 | 0.0003 | Fe and impurities |
| 6 | 9.92 | 4.77 | 2.07 | 0.86 | 0.0045 | 0.18 | 0.005 | 0.0029 | 0.0005 | 0.0002 | Fe and impurities |
| 7 | 9.91 | 7.09 | 2.02 | 0.85 | 0.0054 | 0.18 | 0.004 | 0.0035 | 0.0005 | 0.0006 | Fe and impurities |
| 8 | 14.85 | 0.23 | 2.09 | 0.85 | 0.0003 | 0.18 | 0.003 | 0.0015 | 0.0005 | 0.0009 | Fe and impurities |

*C, Si, P, S, N and O are impurties

These 8 types of steel ingots were heated to 1100° C., and were subjected to hot forging, and thus hot forged members having a thickness of 20 mm were obtained. The hot forged members were heated to 1100° C. again, and were subjected to hot rolling, and thus hot rolled members having a thickness of 3 mm were obtained. Oxidized scales on the surface were removed by pickling and buffing to achieve a thickness of 2.85 mm, and thereafter cold rolling with a total rolling reduction rate of 93% was performed, with the result that semi-hard magnetic materials of thin plates having a thickness of 0.2 mm were obtained.

Strip specimens having a width of 8 mm and a length of 90 mm were cut from the semi-hard magnetic materials of thin plates, were subjected to aging treatment in which they were retained for one hour at each of temperatures of 600° C., 625° C. and 650° C. in a furnace of Ar atmosphere and were then cooled.

A direct-current magnetic field whose maximum application magnetic field was 8000 A/m was applied with a direct-current magnetometer to the strip specimens subjected to the aging treatment, and thus the B—H curve was measured. From the B—H curve, a magnetic flux density B8000 (T) at 8000 A/m, a residual magnetic flux density Br (T), a squareness ratio Br/B8000 and a coercivity Hc (A/m) were determined.

The hardness of each of the specimens was measured with a Vickers hardness tester (load of 100 g).

For the alloy No. 3 in the composition range specified in the present invention and the alloy No. 8 in the conventional example, the magnetic property and the hardness were also measured in a state where the cold rolling with a total rolling reduction rate of 93% was performed. The measurement values of the magnetic property and the hardness were listed and shown in Table 2.

TABLE 2

| No | Process | Magnetic flux density B8000 (T) | Residual magnetic flux density Br (T) | Squaness ratio Br/B8000 | Coercivity Hc (A/m) | Hardness Hv | Remarks |
| --- | --- | --- | --- | --- | --- | --- | --- |
| 1 | (CR)93%→(Ag)575° C. × 1 h AC | 1.65 | 1.35 | 0.818 | 1011 | 574 | Present invention |
|   | (CR)93%→(Ag)600° C. × 1 h AC | 1.65 | 1.35 | 0.818 | 1184 | 533 | Present invention |
|   | (CR)93%→(Ag)625° C. × 1 h AC | 1.65 | 1.35 | 0.818 | 1245 | 431 | Present invention |
|   | (CR)93%→(Ag)650° C. × 1 h AC | 1.66 | 1.39 | 0.837 | 1265 | 409 | Present invention |
| 2 | (CR)93%→(Ag)575° C. × 1 h AC | 1.65 | 1.37 | 0.830 | 1118 | 608 | Present invention |
|   | (CR)93%→(Ag)600° C. × 1 h AC | 1.67 | 1.38 | 0.826 | 1303 | 548 | Present invention |
|   | (CR)93%→(Ag)625° C. × 1 h AC | 1.69 | 1.40 | 0.828 | 1522 | 473 | Present invention |
|   | (CR)93%→(Ag)650° C. × 1 h AC | 1.67 | 1.39 | 0.832 | 1962 | 415 | Present invention |
| 3 | (CR)93% | 1.61 | 0.68 | 0.422 | 1122 | 435 | Comparative example |
|   | (CR)93%→(Ag)575° C. × 1 h AC | 1.78 | 1.49 | 0.837 | 1206 | 642 | Present invention |
|   | (CR)93%→(Ag)600° C. × 1 h AC | 1.68 | 1.41 | 0.839 | 1582 | 537 | Present invention |
|   | (CR)93%→(Ag)625° C. × 1 h AC | 1.66 | 1.39 | 0.837 | 1882 | 468 | Present invention |
|   | (CR)93%→(Ag)650° C. × 1 h AC | 1.60 | 1.28 | 0.800 | 2363 | 417 | Comparative example |
| 4 | (CR)93%→(Ag)575° C. × 1 h AC | 1.74 | 1.49 | 0.856 | 965 | 631 | Comparative example |
|   | (CR)93%→(Ag)600° C. × 1 h AC | 1.73 | 1.47 | 0.850 | 1221 | 563 | Present invention |
|   | (CR)93%→(Ag)625° C. × 1 h AC | 1.74 | 1.48 | 0.851 | 1502 | 483 | Present invention |
|   | (CR)93%→(Ag)650° C. × 1 h AC | 1.73 | 1.48 | 0.855 | 1581 | 439 | Present invention |
| 5 | (CR)93%→(Ag)575° C. × 1 h AC | 1.67 | 1.38 | 0.826 | 1204 | 616 | Present invention |
|   | (CR)93%→(Ag)600° C. × 1 h AC | 1.65 | 1.39 | 0.842 | 1639 | 558 | Present invention |
|   | (CR)93%→(Ag)625° C. × 1 h AC | 1.58 | 1.37 | 0.867 | 1966 | 478 | Present invention |
|   | (CR)93%→(Ag)650° C. × 1 h AC | 1.51 | 1.21 | 0.801 | 2690 | 420 | Comparative example |
| 6 | (CR)93%→(Ag)575° C. × 1 h AC | 1.59 | 1.29 | 0.811 | 1520 | 618 | Comparative example |
|   | (CR)93%→(Ag)600° C. × 1 h AC | 1.45 | 1.22 | 0.841 | 2360 | 525 | Comparative example |
|   | (CR)93%→(Ag)625° C. × 1 h AC | 1.00 | 0.83 | 0.830 | 3293 | 457 | Comparative example |
|   | (CR)93%→(Ag)650° C. × 1 h AC | 1.31 | 1.06 | 0.809 | 3710 | 430 | Comparative example |

TABLE 2-continued

| No | Process | Magnetic flux density B8000 (T) | Residual magnetic flux density Br (T) | Squaness ratio Br/B8000 | Coercivity Hc (A/m) | Hardness Hv | Remarks |
|---|---|---|---|---|---|---|---|
| 7 | (CR)93%→(Ag)575° C. × 1 h AC | 1.25 | 1.06 | 0.848 | 2718 | 611 | Comparative example |
|   | (CR)93%→(Ag)600° C. × 1 h AC | 0.84 | 0.69 | 0.821 | 3772 | 537 | Comparative example |
|   | (CR)93%→(Ag)625° C. × 1 h AC | 0.40 | 0.28 | 0.700 | 4058 | 475 | Comparative example |
|   | (CR)93%→(Ag)650° C. × 1 h AC | 0.46 | 0.32 | 0.696 | 4691 | 428 | Comparative example |
| 8 | (CR)93% | 1.59 | 0.69 | 0.434 | 1283 | 434 | Conventional example |
|   | (CR)93%→(Ag)575° C. × 1 h AC | 1.65 | 1.43 | 0.867 | 1667 | 573 | Conventional example |
|   | (CR)93%→(Ag)600° C. × 1 h AC | 1.63 | 1.42 | 0.871 | 1890 | 519 | Conventional example |
|   | (CR)93%→(Ag)625° C. × 1 h AC | 1.59 | 1.39 | 0.874 | 2208 | 481 | Conventional example |
|   | (CR)93%→(Ag)650° C. × 1 h AC | 1.58 | 1.32 | 0.835 | 2912 | 450 | Conventional example |

*(CR): cold rolling, %: total rolling reduction rate, (Ag): aging treatment, AC: air cooling As shown in Table 2, it is found that in the semi-hard magnetic materials to which the composition range and the aging treatment conditions specified in the present invention were applied, it is possible to obtain the stable and excellent magnetic flux density and residual magnetic flux density. However, in the alloy No. 3 in which Ni exceeds 10%, depending on the aging treatment conditions, in some cases, the residual magnetic flux density did not reach 1.3 T, it is found that when the Ni content approaches the upper limit specified in the present invention, it is important to appropriately select the aging treatment temperature. Also in the alloy No. 5 in which the Mn content exceeds 3.0%, depending on the aging treatment conditions, in some cases, the residual magnetic flux density did not reach 1.3 T, and the coercivity exceeded 2400 A/m, it is found that when the Mn content approaches the upper limit specified in the present invention, it is important to appropriately select the aging treatment temperature.

In the alloy No. 6 of a comparative example in which Mn exceeds the range of the present invention, only when the aging treatment temperature varied by 25° C., the magnetic property became unstable. The residual magnetic flux density was slightly low. In the alloy No. 7 of a comparative example in which Mn is contained more, the magnetic flux density and the residual magnetic flux density were low, and the magnetic property was more unstable.

When the No. 3 alloy in the composition range specified in the present invention and the No. 8 alloy in the conventional example are compared with each other, in the magnetic property remained in cold rolling ((CR) 93% in the table) and the magnetic property ((CR) 93% in the table—(Ag) 600° C.×1 h AC) after the aging treatment at 600° C. for one hour, both in the No. 3 alloy and the No. 8 alloy, the residual magnetic flux density Br and the coercivity Hc were significantly increased by performing the aging treatment. In particular, it is found that in order to obtain the residual magnetic flux density Br of 1.3 T or more required for the magnetic bias thread of the theft-prevention magnetic sensor, it is effective to perform the aging treatment after the cold rolling.

With respect to the Vickers hardness after the cold rolling and the aging treatment, the aging treatment at 600° C. was performed, and thus the hardness was increased from 435 to 537 in the No. 3 alloy of the present invention. This is probably because Al and Ti contained in the semi-hard magnetic material with Ni produced and precipitated the intermetallic compound, and the precipitated intermetallic compound affected the magnetic property to increase the coercivity and the residual magnetic flux density.

Hence, it can be said that in order to adjust the magnetic property of the semi-hard magnetic material, it is effective to perform the aging treatment after the cold rolling.

A relationship between the chemical composition and the magnetic property of the semi-hard magnetic materials subjected to the aging treatment at each temperature was examined.

FIG. 1 shows the effect of the amount of Ni exerted on the residual magnetic flux density Br and the coercivity Hc.

In each of the aging treatment temperatures, the coercivity was increased as the amount of Ni was increased, and as the aging treatment temperature was increased from 600° C. to 625° C. and to 650° C., the coercivity tended to be increased. In FIG. 1, in any case, the coercivity of 1000 to 2400 A/m that the magnetic bias thread of the conventional example shown in patent document 1 had was obtained.

Although the residual magnetic flux density was varied with the amount of Ni, the behavior of the variation was made to differ by the aging treatment temperature.

Specifically, the residual magnetic flux density after the aging treatment at 600° C. was monotonously increased as the amount of Ni was increased from 6.07% (the No. 1 alloy), to 7.80% (the No. 2 alloy) and to 10.03% (the No. 3 alloy). After the aging treatment at 625° C., the residual magnetic flux density was increased when the amount of Ni was 6.07% (the No. 1 alloy) or 7.80% (the No. 2 alloy) whereas the residual magnetic flux density remained substantially the same when the amount of Ni was 7.80% (the No. 2 alloy) or 10.03% (the No. 3 alloy). Furthermore, after the aging treatment at 650° C., the residual magnetic flux density remained substantially the same when the amount of Ni was 6.07% (the No. 1 alloy) or 7.80% (the No. 2 alloy), and then the residual magnetic flux density was decreased when the amount of Ni was 10.03% (the No. 3 alloy).

Hence, it is found that it is possible to obtain an excellent residual magnetic flux density by adjusting the amount of Ni and the aging treatment temperature. In the present invention, although the Ni content is reduced, it is possible to obtain about the same residual magnetic flux density (1.3 T or more) as in the conventional example.

Figure 2:
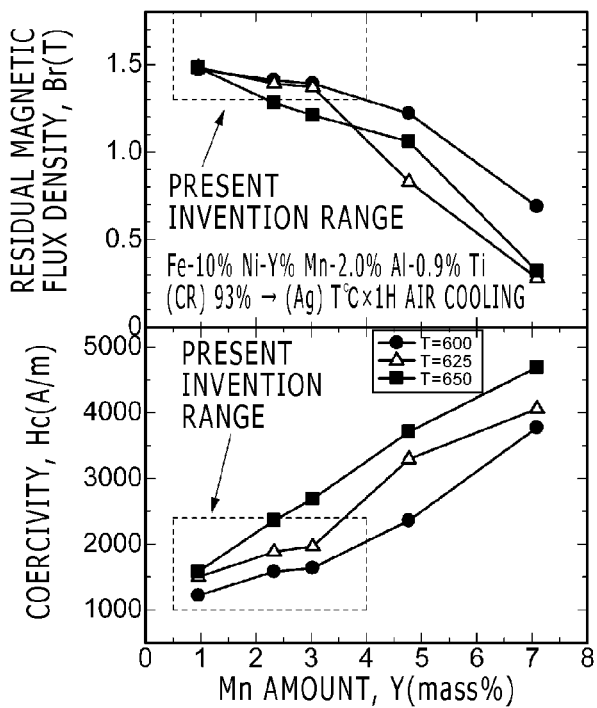
FIG. 2 A diagram showing an example of the relationship between the amount of Mn and the magnetic property of the semi-hard magnetic material.
Figure 3:
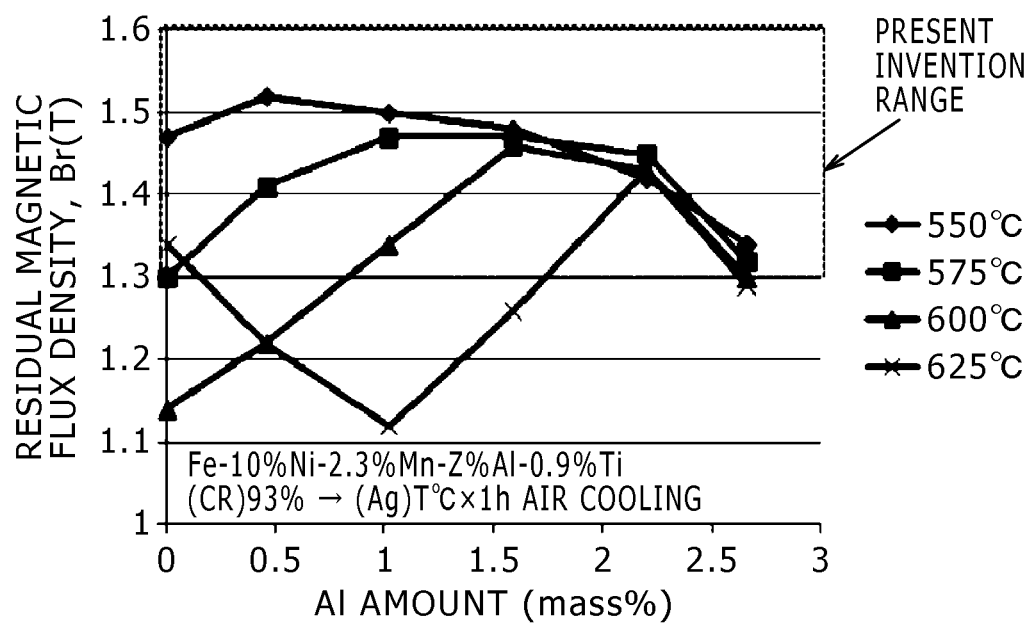
FIG. 3 A diagram showing an example of the relationship between the amount of Al and the residual magnetic flux density of the semi-hard magnetic material.
Figure 4:
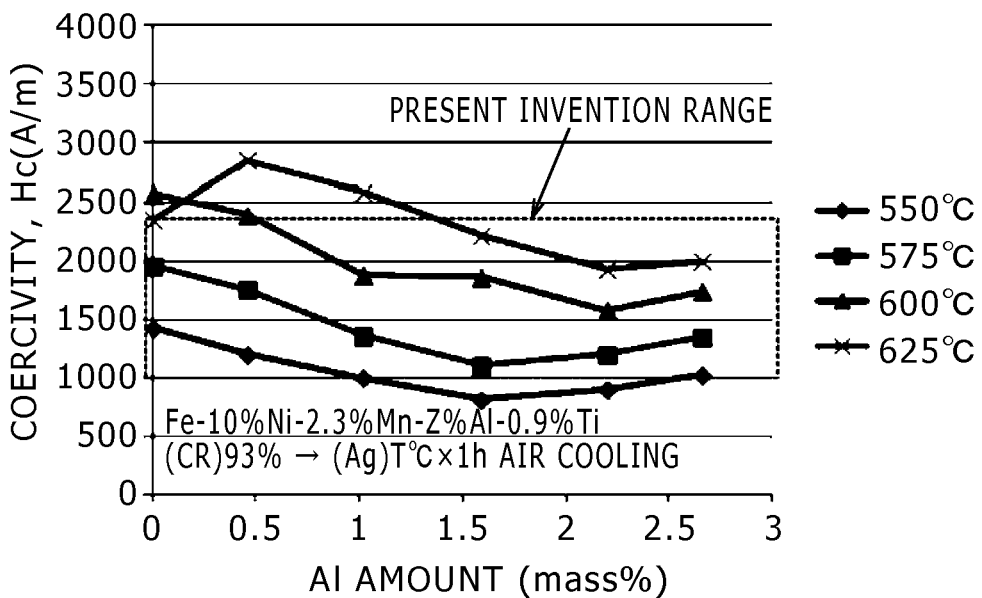
FIG. 4 A diagram showing an example of the relationship between the amount of Al and the coercivity of the semi-hard magnetic material.
Figure 5:
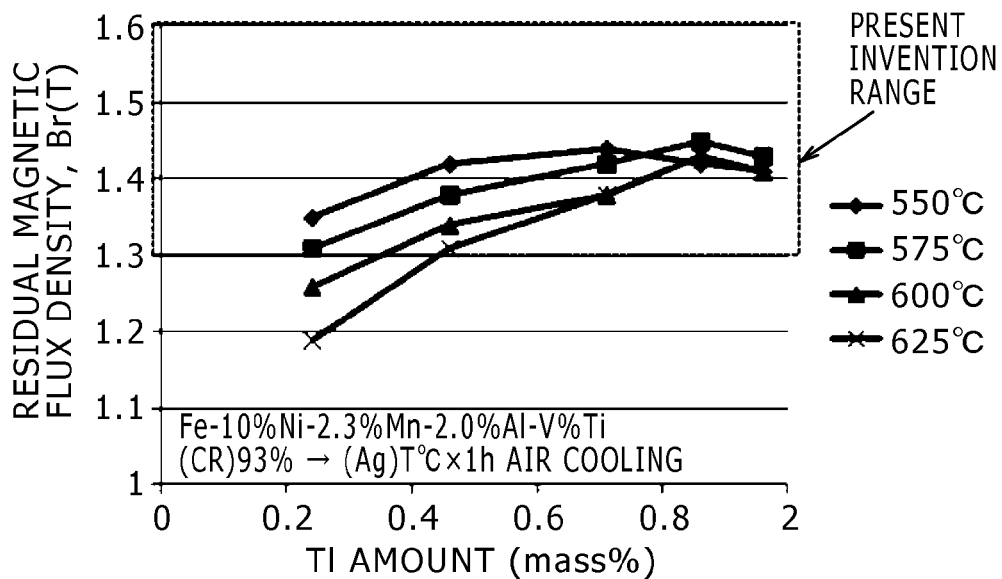
FIG. 5 A diagram showing an example of the relationship between the amount of Ti and the residual magnetic flux density of the semi-hard magnetic material.
Figure 6:
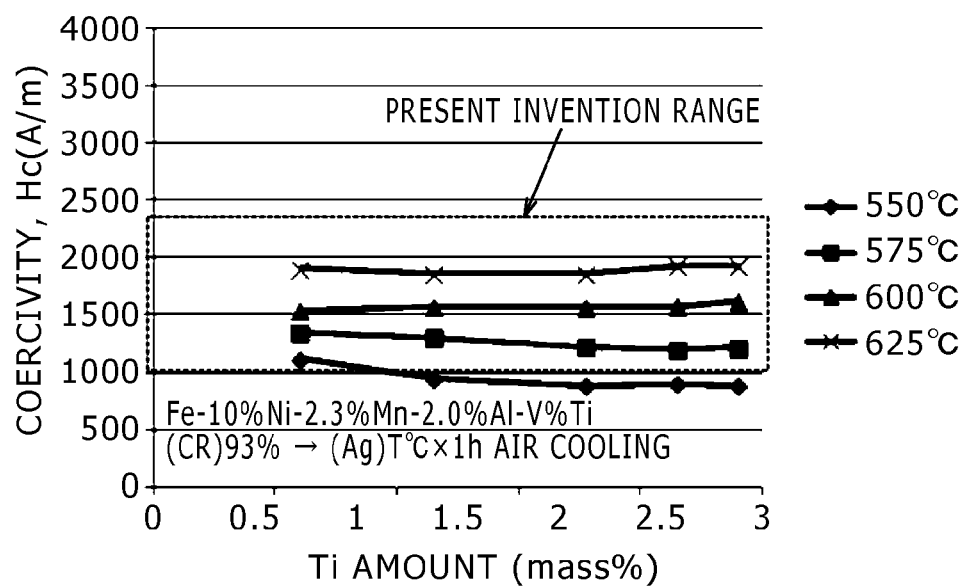
FIG. 6 A diagram showing an example of the relationship between the amount of Ti and the coercivity of the semi-hard magnetic material.
Figure 7:
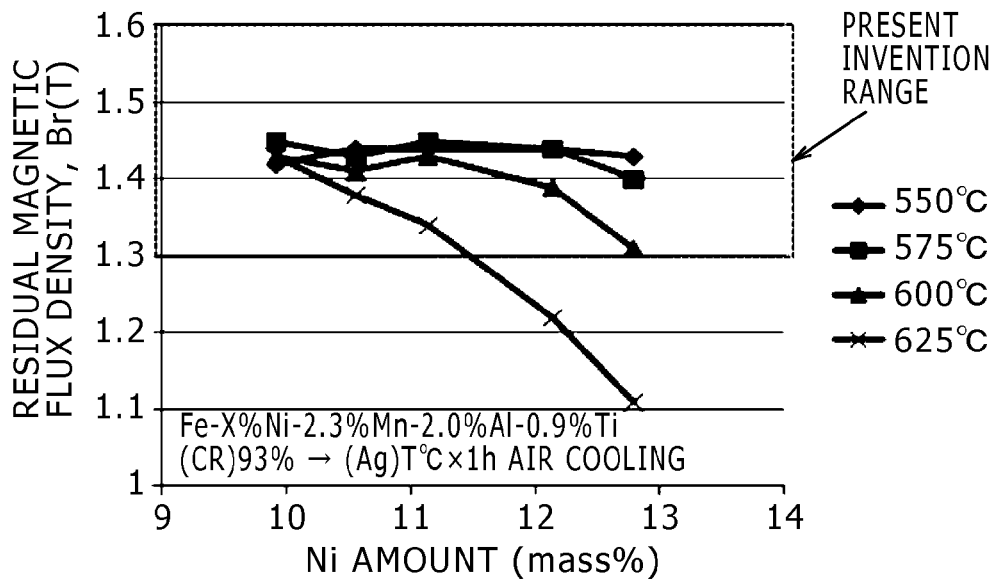
FIG. 7 A diagram showing an example of the relationship between the amount of Ni and the residual magnetic flux density of the semi-hard magnetic material.
Figure 8:
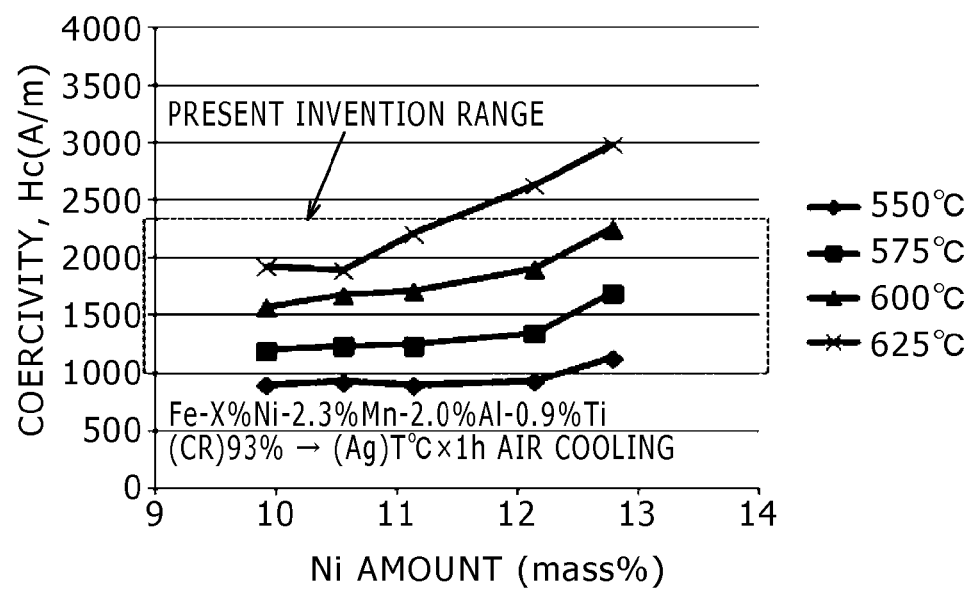
FIG. 8 A diagram showing an example of the relationship between the amount of Ni and the coercivity of the semi-hard magnetic material.

FIG. 2 shows the effect of the amount of Mn exerted on the residual magnetic flux density Br and the coercivity Hc.

Although at any of the aging treatment temperatures, there is a tendency that as the amount of Mn is increased, the residual magnetic flux density is decreased and the coercivity is increased, when the amount of Mn exceeds 4.0% (the alloy No. 6 and the alloy No. 7 in the comparative example), this tendency becomes remarkable in particular. Hence, with Mn specified in the present invention in a range of 0.5 to 4.0% (the alloys Nos. 3 to 5 in the present invention), it is possible to obtain the same coercivity as the coercivity (1000 to 2400 A/m) in the conventional example specified in patent document 1 and substantially the same residual magnetic flux density (1.3 T or more) as in the conventional example.

Example 2

In example 2, in order for variations in the magnetic property in the amounts of Al, Ti and Ni added to the semi-hard magnetic material to be examined, the following specimens were prepared.

Steel ingots of 10 kg for 14 types of semi-hard magnetic materials shown in table 3 were melted and prepared by vacuum melting.

Alloys Nos. 9 to 14 in the table are semi-hard magnetic materials within a composition range specified in the present invention in which Ni, Mn and Ti contents were made substantially constant, and the amount of Al was varied. Alloys Nos. 13 and 15 to 18 are semi-hard magnetic materials within a composition range specified in the present invention in which Ni, Mn and Al contents were made substantially constant, and the amount of Ti was varied. Alloys Nos. 13 and 19 to 22 are semi-hard magnetic materials within a composition range specified in the present invention in which Mn, Al and Ti contents were made substantially constant, and the amount of Ni was varied.

TABLE 3

| | (mass %) | | | | | | | | | | |
|---|---|---|---|---|---|---|---|---|---|---|---|
| No | Ni | Mn | Al | Ti | C | Si | P | S | N | O | Remainder |
| 9 | 9.94 | 2.27 | 0.005 | 0.87 | 0.011 | 0.18 | 0.028 | 0.0017 | 0.0012 | 0.0024 | Fe and impurities |
| 10 | 9.98 | 2.21 | 0.46 | 0.91 | 0.012 | 0.18 | 0.027 | 0.0019 | 0.0014 | 0.0005 | Fe and impurities |
| 11 | 9.95 | 2.20 | 1.02 | 0.89 | 0.011 | 0.23 | 0.028 | 0.0018 | 0.0011 | 0.0005 | Fe and impurities |
| 12 | 9.99 | 2.21 | 1.59 | 0.88 | 0.012 | 0.18 | 0.027 | 0.0018 | 0.0010 | 0.0008 | Fe and impurities |
| 13 | 9.92 | 2.29 | 2.20 | 0.86 | 0.012 | 0.18 | 0.027 | 0.0018 | 0.0008 | 0.0005 | Fe and impurities |
| 14 | 9.91 | 2.22 | 2.66 | 0.84 | 0.012 | 0.19 | 0.028 | 0.0017 | 0.0008 | 0.0003 | Fe and impurities |
| 15 | 9.90 | 2.25 | 2.22 | 0.96 | 0.012 | 0.18 | 0.027 | 0.0018 | 0.0007 | 0.0005 | Fe and impurities |
| 16 | 9.95 | 2.30 | 2.19 | 0.71 | 0.012 | 0.18 | 0.027 | 0.0019 | 0.0007 | 0.0005 | Fe and impurities |
| 17 | 9.94 | 2.22 | 2.17 | 0.46 | 0.012 | 0.18 | 0.027 | 0.0019 | 0.0008 | 0.0007 | Fe and impurities |
| 18 | 9.93 | 2.34 | 2.13 | 0.24 | 0.011 | 0.18 | 0.027 | 0.0018 | 0.0008 | 0.0004 | Fe and impurities |
| 19 | 10.56 | 2.35 | 2.07 | 0.91 | 0.010 | 0.19 | 0.028 | 0.0022 | 0.0007 | 0.0008 | Fe and impurities |
| 20 | 11.14 | 2.29 | 2.04 | 0.88 | 0.012 | 0.22 | 0.030 | 0.0022 | 0.0007 | 0.0007 | Fe and impurities |
| 21 | 12.14 | 2.39 | 2.05 | 0.89 | 0.010 | 0.20 | 0.028 | 0.0023 | 0.0007 | 0.0009 | Fe and impurities |
| 22 | 12.79 | 2.29 | 2.01 | 0.82 | 0.008 | 0.19 | 0.028 | 0.0020 | 0.0009 | 0.0009 | Fe and impurities |

*C, Si, P, S, N and O are impurties

These 14 types of steel ingots were used under the same conditions as in example 1, and the semi-hard magnetic materials of thin plates having a thickness of 0.2 mm were prepared.

Strip specimens having a width of 8 mm and a length of 90 mm were cut from the semi-hard magnetic materials of thin plates, were subjected to aging treatment in which they were retained for one hour at each of temperatures of 550° C., 575° C., 600° C. and 625° C. in a furnace of Ar atmosphere and were then cooled.

A direct-current magnetic field whose maximum application magnetic field was 8000 A/m was applied with a direct-current magnetometer to the strip specimens subjected to the aging treatment, and thus the B—H curve was measured. From the B—H curve, a magnetic flux density B8000 (T) at 8000 A/m, a residual magnetic flux density Br (T), a squareness ratio Br/B8000 and a coercivity Hc (A/m) were determined.

The hardness of each of the specimens was measured with a Vickers hardness tester (load of 100 g).

The measurement values of the magnetic property and the hardness were listed and shown in Tables 4 and 5.

TABLE 4

| No | Process | Magnetic flux density B8000 (T) | Residual magnetic flux density Br (T) | Squaness ratio Br/B8000 | Coercivity Hc (A/m) | Hardness Hv | Remarks |
|---|---|---|---|---|---|---|---|
| 9 | (CR)93%→(Ag)550° C. × 1 h AC | 1.71 | 1.47 | 0.860 | 1428 | 402 | Present invention |
|  | (CR)93%→(Ag)575° C. × 1 h AC | 1.49 | 1.30 | 0.872 | 1958 | 371 | Present invention |
|  | (CR)93%→(Ag)600° C. × 1 h AC | 1.32 | 1.14 | 0.864 | 2570 | 348 | Comparative example |
|  | (CR)93%→(Ag)625° C. × 1 h AC | 1.66 | 1.34 | 0.807 | 2352 | 327 | Present invention |
| 10 | (CR)93%→(Aq)550° C. × 1 h AC | 1.76 | 1.52 | 0.864 | 1202 | 498 | Present invention |
|  | (CR)93% (Ag)575° C. × 1 h AC | 1.61 | 1.41 | 0.876 | 1759 | 432 | Present invention |
|  | (CR)93%→(Ag)600° C. × 1 h AC | 1.39 | 1.22 | 0.878 | 2391 | 397 | Comparative example |
|  | (CR)93%→(Ag)625° C. × 1 h AC | 1.46 | 1.22 | 0.836 | 2853 | 361 | Comparative example |
| 11 | (CR)93%→(Ag)550° C. × 1 h AC | 1.77 | 1.50 | 0.847 | 1005 | 525 | Present invention |
|  | (CR)93%→(Ag)575° C. × 1 h AC | 1.72 | 1.47 | 0.855 | 1361 | 469 | Present invention |
|  | (CR)93%→(Ag)600° C. × 1 h AC | 1.56 | 1.34 | 0.859 | 1880 | 420 | Present invention |
|  | (CR)93%→(Ag)625° C. × 1 h AC | 1.36 | 1.12 | 0.824 | 2582 | 372 | Comparative example |
| 12 | (CR)93%→(Ag)550° C. × 1 h AC | 1.74 | 1.48 | 0.851 | 816 | 628 | Comparative example |
|  | (CR)93%→(Ag)575° C. × 1 h AC | 1.71 | 1.47 | 0.860 | 1106 | 540 | Present invention |
|  | (CR)93%→(Ag)600° C. × 1 h AC | 1.71 | 1.46 | 0.854 | 1862 | 498 | Present invention |
|  | (CR)93%→(Ag)625° C. × 1 h AC | 1.50 | 1.26 | 0.840 | 2218 | 421 | Comparative example |
| 13 | (CR)93%→(Ag)550° C. × 1 h AC | 1.70 | 1.42 | 0.835 | 903 | 631 | Comparative example |
|  | (CR)93%→(Ag)575° C. × 1 h AC | 1.74 | 1.45 | 0.833 | 1202 | 583 | Present invention |
|  | (CR)93%→(Ag)600° C. × 1 h AC | 1.72 | 1.43 | 0.831 | 1580 | 513 | Present invention |
|  | (CR)93%→(Ag)625° C. × 1 h AC | 1.70 | 1.43 | 0.841 | 1930 | 445 | Present invention |
| 14 | (CR)93%→(Ag)550° C. × 1 h AC | 1.62 | 1.34 | 0.827 | 1027 | 620 | Present invention |
|  | (CR)93%→(Ag)575° C. × 1 h AC | 1.60 | 1.32 | 0.825 | 1349 | 589 | Present invention |
|  | (CR)93%→(Ag)600° C. × 1 h AC | 1.59 | 1.30 | 0.818 | 1743 | 537 | Present invention |
|  | (CR)93%→(Ag)625° C. × 1 h AC | 1.59 | 1.29 | 0.811 | 2001 | 473 | Comparative example |
| 15 | (CR)93%→(Ag)550° C. × 1 h AC | 1.67 | 1.41 | 0.844 | 887 | 652 | Comparative example |
|  | (CR)93%→(Ag)575° C. × 1 h AC | 1.69 | 1.43 | 0.846 | 1214 | 597 | Present invention |
|  | (CR)93%→(Ag)600° C. × 1 h AC | 1.67 | 1.41 | 0.844 | 1619 | 540 | Present invention |
|  | (CR)93%→(Ag)625° C. × 1 h AC | 1.66 | 1.41 | 0.850 | 1930 | 468 | Present invention |

TABLE 5

| No | Process | Magnetic flux density B8000 (T) | Residual magnetic flux density Br (T) | Squaness ratio Br/B8000 | Coercivity Hc (A/m) | Hardness Hv | Remarks |
|---|---|---|---|---|---|---|---|
| 16 | (CR)93%→(Ag)550° C. × 1 h AC | 1.70 | 1.44 | 0.847 | 887 | 639 | Comparative example |
|  | (CR)93%→(Ag)575° C. × 1 h AC | 1.68 | 1.42 | 0.845 | 1224 | 607 | Present invention |
|  | (CR)93%→(Ag)600° C. × 1 h AC | 1.67 | 1.38 | 0.826 | 1568 | 562 | Present invention |
|  | (CR)93%→(Ag)625° C. × 1 h AC | 1.65 | 1.38 | 0.836 | 1858 | 468 | Present invention |

TABLE 5-continued

| No | Process | Magnetic flux density B8000 (T) | Residual magnetic flux density Br (T) | Squaness ratio Br/B8000 | Coercivity Hc (A/m) | Hardness Hv | Remarks |
|---|---|---|---|---|---|---|---|
| 17 | (CR)93%→(Ag)550° C. × 1 h AC | 1.70 | 1.42 | 0.835 | 945 | 603 | Comparative example |
|  | (CR)93%→(Ag)575° C. × 1 h AC | 1.68 | 1.38 | 0.821 | 1305 | 550 | Present invention |
|  | (CR)93%→(Ag)600° C. × 1 h AC | 1.65 | 1.34 | 0.812 | 1572 | 491 | Present invention |
|  | (CR)93%→(Ag)625° C. × 1 h AC | 1.63 | 1.31 | 0.804 | 1858 | 436 | Present invention |
| 18 | (CR)93%→(Ag)550° C. × 1 h AC | 1.66 | 1.35 | 0.813 | 1114 | 569 | Present invention |
|  | (CR)93%→(Ag)575° C. × 1 h AC | 4.64 | 1.31 | 0.799 | 1349 | 524 | Present invention |
|  | (CR)93%→(Ag)600° C. × 1 h AC | 1.62 | 1.26 | 0.778 | 1542 | 474 | Comparative example |
|  | (CR)93%→(Ag)625° C. × 1 h AC | 1.56 | 1.19 | 0.763 | 1902 | 405 | Comparative example |
| 19 | (CR)93%→(Ag)550° C. × 1 h AC | 1.71 | 1.44 | 0.842 | 923 | 617 | Comparative example |
|  | (CR)93%→(Ag)575° C. × 1 h AC | 1.69 | 1.43 | 0.846 | 1241 | 568 | Present invention |
|  | (CR)93%→(Ag)600° C. × 1 h AC | 1.67 | 1.41 | 0.844 | 1683 | 508 | Present invention |
|  | (CR)93%→(Ag)625° C. × 1 h AC | 1.64 | 1.38 | 0.841 | 1900 | 445 | Present invention |
| 20 | (CR)93%→(Ag)550° C. × 1 h AC | 1.71 | 1.44 | 0.842 | 899 | 629 | Comparative example |
|  | (CR)93%→(Ag)575° C. × 1 h AC | 1.70 | 1.45 | 0.853 | 1243 | 596 | Present invention |
|  | (CR)93%→(Ag)600° C. × 1 h AC | 1.68 | 1.43 | 0.851 | 1721 | 519 | Present invention |
|  | (CR)93%→(Ag)625° C. × 1 h AC | 1.57 | 1.34 | 0.854 | 2218 | 450 | Present invention |
| 21 | (CR)93%→(Ag)550° C. × 1 h AC | 1.71 | 1.44 | 0.842 | 935 | 628 | Comparative example |
|  | (CR)93%→(Ag)575° C. × 1 h AC | 1.69 | 1.44 | 0.852 | 1353 | 585 | Present invention |
|  | (CR)93%→(Ag)600° C. × 1 h AC | 1.63 | 1.39 | 0.853 | 1910 | 518 | Present invention |
|  | (CR)93%→(Ag)625° C. × 1 h AC | 1.44 | 1.22 | 0.847 | 2634 | 443 | Comparative example |
| 22 | (C R)93%→(Ag)550° C. × 1 h AC | 1.70 | 1.43 | 0.841 | 1134 | 611 | Present invention |
|  | (CR)93%→(Ag)575° C. × 1 h AC | 1.65 | 1.40 | 0.848 | 1701 | 557 | Present invention |
|  | (CR)93%→(Ag)600° C. × 1 h AC | 1.54 | 1.31 | 0.851 | 2260 | 496 | Present invention |
|  | (CR)93%→(Ag)625° C. × 1 h AC | 1.34 | 1.11 | 0.828 | 2992 | 429 | Comparative example |

As shown in Tables 4 and 5, it is found that in the semi-hard magnetic materials to which the composition range and the aging treatment conditions specified in the present invention were applied, it is possible to obtain a stable and excellent magnetic flux density, residual magnetic flux density and coercivity. However, variations in the residual magnetic flux density and the coercivity of the present materials differ depending on the amounts of Al, Ti and Ni added and the aging treatment temperature.

The relationship between the amounts of Al, Ti and Ni and the magnetic property in the semi-hard magnetic material subjected to the aging treatment at each temperature is shown in FIGS. 3 to 8.

In the alloys Nos. 9 to 14, with respect to the residual magnetic flux density of the present materials, there is a tendency that the variations in the residual magnetic flux density at each aging treatment temperature are decreased as the amount of Al added is increased. There is a tendency that the coercivity is decreased as the amount of Al added is increased and that the coercivity is increased with the aging treatment temperature. When the amount of Al added is small and the aging treatment temperature is high, the coercivity exceeds 2400 A/m.

As described above, in the semi-hard magnetic materials in the composition range specified in the present invention, when the amount of Al added is large, there is a tendency that it is possible to obtain a stably excellent magnetic property of the present materials and that the range of the aging treatment temperatures is wide.

In the alloys Nos. 13 and 15 to 18, there is a tendency that the residual magnetic flux density of the present materials is increased with the amount of Ti added, and that the residual magnetic flux density of the present materials is decreased as the aging treatment temperature is increased. There is a tendency that the coercivity remains substantially the same in any of the amounts of Ti added, and that the coercivity is increased with the aging treatment temperature.

As described above, in the semi-hard magnetic materials in the composition range specified in the present invention, when the amount of Ti added is large, there is a tendency that it is possible to obtain a stably excellent magnetic property of the present materials and that the range of the aging treatment temperatures is wide.

In the alloys Nos. 13 and 19 to 22, there is a tendency that when the aging treatment temperatures are 550° C. and 575° C., the residual magnetic flux density remains substantially the same in any of the amounts of Ni added. On the other hand, there is a tendency that when the aging treatment temperatures are 600° C. and 625° C., the residual magnetic flux density is decreased as the amount of Ni added is increased. There is also a tendency that the residual magnetic flux density is decreased as the aging treatment temperature is increased. There is also a tendency that the coercivity is increased with the amount of Ni added and the aging treatment temperature. However, when the amount of Ni added is large and the aging treatment temperature is high, the coercivity exceeds 2400 A/m.

As described above, in the semi-hard magnetic materials in the composition range specified in the present invention, when the amount of Ni added is 12% or less, there is a tendency that it is possible to obtain a stably excellent magnetic property of the present materials and that the range of the aging treatment temperatures is wide.

Example 3

In example 3, in order for variations in the magnetic property in the semi-hard magnetic material having a thickness of 0.045 mm to be examined, the following specimens were prepared.

Steel ingots of 10 kg for 4 types of semi-hard magnetic materials shown in table 6 were melted and prepared by vacuum melting.

Alloys Nos. 23 to 25 in the table are semi-hard magnetic materials within a composition range specified in the present invention in which Ni, Mn and Ti contents were made substantially constant, and the amount of Al was varied. Alloys Nos. 24 and 26 are semi-hard magnetic materials within a composition range specified in the present invention in which Ni, Mn and Al contents were made substantially constant, and the amount of Ti was varied.

TABLE 6

| | (mass %) | | | | | | | | | |
|---|---|---|---|---|---|---|---|---|---|---|
| No | Ni | Mn | Al | Ti | C | Si | P | S | N | O | Remainder |
| 23 | 9.71 | 2.27 | 2.05 | 0.87 | 0.012 | 0.19 | 0.026 | 0.0025 | 0.0007 | 0.0005 | Fe and impurities |
| 24 | 9.78 | 2.17 | 1.55 | 0.89 | 0.011 | 0.18 | 0.026 | 0.0023 | 0.0008 | 0.0010 | Fe and impurities |
| 25 | 9.94 | 2.23 | 1.00 | 0.90 | 0.013 | 0.19 | 0.027 | 0.0022 | 0.0008 | 0.0005 | Fe and impurities |
| 26 | 9.72 | 2.27 | 1.48 | 0.46 | 0.012 | 0.18 | 0.025 | 0.0023 | 0.0010 | 0.0011 | Fe and impurities |

*C, Si, P, S N and O are impurties

These 4 types of steel ingots were heated to 1100° C., and were subjected to hot forging, and thus hot forged members having a thickness of 20 mm were obtained. The hot forged members were heated to 1100° C. again, and were subjected to hot rolling, and thus hot rolled members having a thickness of 3 mm were obtained. Oxidized scales on the surface were removed by pickling and buffing to achieve a thickness of 2.85 mm, and thereafter cold rolling with a total rolling reduction rate of 98.5% was performed, with the result that semi-hard magnetic materials of foil material having a thickness of 0.045 mm were obtained.

Strip specimens having a width of 8 mm and a length of 90 mm were cut from the semi-hard magnetic materials of thin plates, were subjected, in groups of five specimens, to aging treatment in which they were retained for one hour at each of temperatures of 570° C., 580° C., 590° C., 600° C., 610° C. and 620° C. in a furnace of Ar atmosphere and were then cooled.

A direct-current magnetic field whose maximum application magnetic field was 8000 A/m was applied with a direct-current magnetometer to the five strip specimens subjected to the aging treatment, and thus the B—H curve was measured. From the B—H curve, a magnetic flux density B8000 (T) at 8000 A/m, a residual magnetic flux density Br (T), a squareness ratio Br/B8000 and a coercivity Hc (A/m) were determined.

The hardness of each of the specimens was measured with a Vickers hardness tester (load of 100 g).

The measurement values of the magnetic property and the hardness were listed and shown in Table 7.

TABLE 7

| No | Process | Magnetic flux density B8000 (T) | Residual magnetic flux density Br (T) | Squaness ratio Br/B8000 | Coercivity Hc (A/m) | Hardness Hv | Remarks |
|---|---|---|---|---|---|---|---|
| 23 | (CR)98%→(Ag)570° C. × 1 h AC | 1.71 | 1.45 | 0.848 | 1273 | 561 | Present invention |
| | (CR)98%→(Ag)580° C. × 1 h AC | 1.70 | 1.44 | 0.847 | 1878 | 550 | Present invention |
| | (CR)98%→(Ag)590° C. × 1 h AC | 1.69 | 1.43 | 0.846 | 1743 | 520 | Present invention |
| | (CR)98%→(Ag)600° C. × 1 h AC | 1.68 | 1.42 | 0.846 | 1834 | 501 | Present invention |
| | (CR)98%→(Ag)610° C. × 1 h AC | 1.66 | 1.40 | 0.843 | 1966 | 465 | Present invention |
| | (CR)98%→(Ag)620° C. × 1 h AC | 1.63 | 1.37 | 0.840 | 1980 | 438 | Present invention |
| 24 | (CR)98%→(Ag)570° C. × 1 h AC | 1.78 | 1.54 | 0.865 | 1122 | 540 | Present invention |
| | (CR)98%→(Ag)580° C. × 1 h AC | 1.74 | 1.51 | 0.868 | 1802 | 516 | Present invention |
| | (CR)98%→(Ag)590° C. × 1 h AC | 1.74 | 1.51 | 0.868 | 1552 | 485 | Present invention |
| | (CR)98%→(Ag)600° C. × 1 h AC | 1.73 | 1.50 | 0.867 | 1621 | 464 | Present invention |
| | (CR)98%→(Ag)610° C. × 1 h AC | 1.67 | 1.45 | 0.868 | 1886 | 421 | Present invention |
| | (CR)98%→(Ag)620° C. × 1 h AC | 1.56 | 1.33 | 0.853 | 2218 | 402 | Present invention |
| 25 | (CR)98%→(Ag)570° C. × 1 h AC | 1.75 | 1.49 | 0.851 | 1767 | 483 | Present invention |
| | (CR)98%→(Ag)580° C. × 1 h AC | 1.72 | 1.48 | 0.860 | 1528 | 456 | Present invention |
| | (CR)98%→(Ag)590° C. × 1 h AC | 1.67 | 1.43 | 0.856 | 1641 | 444 | Present invention |
| | (CR)98%→(Ag)600° C. × 1 h AC | 1.57 | 1.36 | 0.866 | 1878 | 416 | Present invention |
| | (CR)98%→(Ag)610° C. × 1 h AC | 1.50 | 1.29 | 0.860 | 2009 | 382 | Comparative example |
| | (CR)98%→(Ag)620° C. × 1 h AC | 1.39 | 1.19 | 0.856 | 2423 | 368 | Comparative example |
| 26 | (CR)98%→(Ag)570° C. × 1 h AC | 1.76 | 1.50 | 0.852 | 1170 | 514 | Present invention |
| | (CR)98%→(Ag)580° C. × 1 h AC | 1.75 | 1.48 | 0.846 | 1341 | 464 | Present invention |
| | (CR)98%→(Ag)590° C. × 1 h AC | 1.74 | 1.47 | 0.845 | 1500 | 460 | Present invention |
| | (CR)98%→(Ag)600° C. × 1 h AC | 1.70 | 1.43 | 0.841 | 1639 | 433 | Present invention |
| | (CR)98%→(Ag)610° C. × 1 h AC | 1.59 | 1.33 | 0.836 | 1938 | 405 | Present invention |
| | (CR)98%→(Ag)620° C. × 1 h AC | 1.54 | 1.24 | 0.805 | 2113 | 376 | Comparative example |

The compositions of the semi-hard magnetic materials of the alloys Nos. 23, 24 and 25 are substantially the same as those of the alloys Nos. 13, 12 and 11. As shown in Table 6, it is found that in the semi-hard magnetic materials to which the composition range specified in the present invention and the aging treatment conditions are applied and which have a thickness of 0.045 mm, as compared with those having a thickness of 0.2 mm, it is possible to obtain more excellent magnetic flux density and residual magnetic flux density.

In the semi-hard magnetic materials in the composition range specified in the present invention, when the amounts of Al and Ti added are large, there is a tendency that it is possible to obtain a stably excellent magnetic property of the present materials and that the range of the aging treatment temperatures is wide.

As a result of what has been described above, it is found that in the semi-hard magnetic material of the present invention in which the range of the components of the semi-hard magnetic material is adjusted within the range of the components specified in the present invention and on which an appropriate aging treatment is performed, though Ni is reduced as compared with the No. 8 alloy in the conventional example, it is possible to obtain the same coercivity and residual magnetic flux density as in the conventional example.

Hence, it is found that the semi-hard magnetic material of the present invention maintains the same level of magnetic property as the conventional semi-hard magnetic material.

INDUSTRIAL APPLICABILITY

In the present invention, the magnetic property of the conventional semi-hard magnetic material is maintained, and the Ni content is reduced, and thus it is possible to obtain the effect of resource saving and inexpensiveness. Hence, the present invention can be applied to an application where a large amount of semi-hard magnetic material is used, such as the magnetic bias thread of the theft-prevention magnetic sensor in a large volume retailer.

The invention claimed is:

1. A semi-hard magnetic material, comprising:
   equal to or more than 5.0% but less than 13.0% of Ni by mass, equal to or more than 1.0% but equal to or less than 4.0% of Mn by mass, more than 0% but equal to or less than 3.0% of Al by mass, more than 0% but equal to or less than 1.0% of Ti by mass and a remainder of Fe and an impurity;
   a coercivity of 1000 to 2400 A/m and
   a residual magnetic flux density of 1.3 T or more.

2. The semi-hard magnetic material of claim 1,
   wherein the semi-hard magnetic material is a thin plate having a thickness of 0.030 to 0.30 mm.

3. A theft-prevention magnetic sensor, comprising:
   a magnetic bias thread is formed of the semi-hard magnetic material of claim 1; and
   a warning thread formed of an amorphous ferromagnetic alloy and combined with the magnetic bias thread.

4. A method of manufacturing the semi-hard magnetic material of claim 1, the method comprising:
   cold rolling, a material comprising equal to or more than 5.0% but less than 13.0% of Ni by mass, equal to or more than 1.0% but equal or less than 4.0% if Mn by mass, more than 0% but equal to or less than 3.0% of Al by mass, more than 0% but equal to or less than 1.0% of Ti by mass and a remainder of Fe and an impurity; and
   after the cold rolling, performing an aging treatment on the cold-rolled material at a temperature of 520 to 680° C.

5. A theft-prevention magnetic sensor, comprising:
   a magnetic bias thread formed of the semi-hard magnetic material of claim 2; and
   a warning thread formed of an amorphous ferromagnetic alloy and combined with the magnetic bias thread.

6. A method of manufacturing the semi-hard magnetic material of claim 2, the method comprising:
   cold rolling a material comprising equal to or more than 5.0% but less than 13.0% of Ni by mass, equal to or more than 1.0% but equal to or less than 4.0% of Mn by mass, more than 0% but equal to or less than 3.0% of Al by mass, more than 0% but equal to or less than 1.0% of Ti by mass and a remainder of Fe and an impurity; and
   after the cold rolling, performing an aging treatment on the cold-rolled material at a temperature of 520to 680° C.

* * * * *

UNITED STATES PATENT AND TRADEMARK OFFICE
CERTIFICATE OF CORRECTION

| | | |
|---|---|---|
| PATENT NO. | : 9,500,720 B2 | Page 1 of 1 |
| APPLICATION NO. | : 14/239702 | |
| DATED | : November 22, 2016 | |
| INVENTOR(S) | : Masaru Fujiyoshi et al. | |

It is certified that error appears in the above-identified patent and that said Letters Patent is hereby corrected as shown below:

In the Claims

Column 21, Line 9, Claim 1:
After "A/m" insert -- ; --, therefor.

Column 21, Line 21, Claim 4:
Delete "rolling," and insert -- rolling --, therefor.

Column 21, Line 23, Claim 4:
After "equal" insert -- to --, therefor.

Column 21, Line 23, Claim 4:
Delete "if" and insert -- of --, therefor.

Column 22, Line 22, Claim 6:
Delete "520to" and insert -- 520 to --, therefor.

Signed and Sealed this
Seventh Day of March, 2017

Michelle K. Lee
*Director of the United States Patent and Trademark Office*